United States Patent [19]

Kohlhase et al.

[11] Patent Number: 4,783,248

[45] Date of Patent: Nov. 8, 1988

[54] METHOD FOR THE PRODUCTION OF A TITANIUM/TITANIUM NITRIDE DOUBLE LAYER

[75] Inventors: Armin Kohlhase; Gerald Higelin, both of Munich, Fed. Rep. of Germany

[73] Assignee: Siemens Aktiengesellschaft, Berlin and Munich, Fed. Rep. of Germany

[21] Appl. No.: 135,043

[22] Filed: Dec. 18, 1987

[30] Foreign Application Priority Data

Feb. 10, 1987 [DE] Fed. Rep. of Germany ....... 3704055

[51] Int. Cl.$^4$ .................. C23C 15/00; H01L 21/443
[52] U.S. Cl. ............................ 204/192.17; 427/192
[58] Field of Search ................ 204/192.17; 437/192

[56] References Cited

U.S. PATENT DOCUMENTS 4,702,967  10/1987  Black et al. .................... 428/620

OTHER PUBLICATIONS

Kanamori–"Investigation of Reactively Sputtered TiN Films for Diffusion Beariers", *Thin Solid Films,* 136 (1986) pp. 195–214.
Iwabuchi et al.–"A Highly Reliable Pure Al Metalization with Low Contact Resistance Utilizing Oxygen-S-tuffed TiN Bearier Layer" 1986, Symposium on VLSI Technology, May 1986, pp. 55–56.

*Primary Examiner*—Aaron Weisstuch
*Attorney, Agent, or Firm*—Hill, Van Santen, Steadman & Simpson

[57] ABSTRACT

A method for producing consecutive layers of titanium and titanium nitride on a substrate to produce a contact and barrier layer between, for example, aluminum and silicon surfaces or silicide surfaces utilizing cathode sputtering in a one chamber magnetron sputtering system. The titanium and titanium nitride layers each occur as a plurality of individual layers formed in a cyclical process with temperature treatments being carried out between the deposition of the individual layers. During the deposition of the titanium nitride layer, the nitrogen concentration in the reaction gas is adjusted higher than that stoichiometrically required for production of titanium nitride. The resulting combined layers provide low mechanical stressing, good thermal stability, low contact resistance and similar advantages. The method may be employed for the production of megabit-DRAM cells and logic circuits.

9 Claims, 1 Drawing Sheet

METHOD FOR THE PRODUCTION OF A TITANIUM/TITANIUM NITRIDE DOUBLE LAYER

BACKGROUND OF THE INVENTION

Field of the Invention

The present invention relates to a method for the production of double layers composed of titanium and titanium nitride which act as contact and barrier layers between metallizations on an aluminum base and silicon and/or silicide or polysilicide surfaces in VLSI semiconductor circuits. The methods involves cathode sputtering from a titanium target with the addition of nitrogen in a one chamber system including a magnetron.

DESCRIPTION OF THE PRIOR ART

Because of the solubility of silicon in aluminum, there occurs what is known as "spiking" at the aluminum contacts to doped silicon regions (diffusion regions in the substrate) or polysilicon in the manufacture of LSI semiconductor circuits. The aluminum "needles" penetrate into the silicon, potentially leading to short circuits, particularly with increasingly smaller structures and shallower diffusion regions.

Some elimination of the problem can be accomplished by slight additions of silicon to the aluminum employed. This silicon, however, can precipitate at the aluminum/silicon contact surfaces and this can lead to difficulties with respect to transfer resistances.

Another possibility for retarding the actual cause, namely, the diffusion between the doped silicon substrate or the polysilicon with the aluminum metallization is to create a diffusion barrier layer. Nitrides, carbides, and borides of the metals of Groups IVB, VB and VIB of the Periodic Table have been considered as such barrier materials.

The utilization of titanium nitride as a diffusion barrier has been investigated in depth in an article by Kanamori appearing in "Thin Solid Films", Volume 136 (1986), pages 195 to 214. It has been shown that the barrier properties are greatly dependent on the manufacturing method, on the system employed, and on the process parameters that are maintained. Reactive sputtering in a nitrogen-containing sputtering atmosphere is a method that is frequently employed. Some properties of the titanium nitride layers that are produced are drastically altered with increasing nitrogen concentration in the sputtering gas with the sputtering power being kept constant and with a constant overall sputtering pressure. As the morphology of the layers is modified, the color changes from silver to silver-gold, gold, golden brown, and brown-violet-metallic to brown-metallic. After a certain nitrogen concentration is reached in the sputtering atmosphere, the sputtering rate suddenly decreases to about one third whereas the conductivity of the titanium nitride layers produced increases by a factor of about 3. The point at which this occurs also depends on the overall sputtering pressure and on the sputtering power, and is characterized by the presence of a golden color as well as by a ratio of nitrogen to titanium of 1:1 in the layer. Further, this region of "golden stoichiometry" is characterized by a high resistance to diffusion through the titanium nitride layer, thereby apparently providing a material of good barrier properties. However, the mechanical stresses that arise due to this layer are at a maximum. This can result in micro-cracks with subsequent rupture of the barrier.

As described in a report by I. Iwabuchi et al in the conference volume of the 1986 Symposium on VLSI Technology in San Diego, pages 55 to 56, filling up these cracks with oxygen has been proposed as a solution. The overall process, however, is rendered more complicated by an additional after treatment step. Although the barrier layers are usually only about 100 nm thick, regions seem to have unstable specific resistance so that process can not be considered totally reliable.

SUMMARY OF THE INVENTION

The present invention seeks to produce a contact and barrier layer of titanium nitride between an aluminum metallization and silicon crystal surfaces or silicide surfaces and polycide surfaces which satisfies the following requirements:

1. High conductivity should be present.
2. Low contact resistances having slight tolerances should be obtained with through hole diameters in the submicron range when contacting doped single crystal and polycrystalline silicon and layers of metal silicides and polysilicon.
3. The boundary surfaces between the metallization consisting of aluminum/silicon alloy and the silicon regions referred to in requirement (2) must be stable at high current densities and elevated temperatures.
4. The contact and barrier layer must not have a negative influence on the overall process, as, for example, by producing some mechanical stresses.

A high degree of conductivity is provided by employing an aluminum metallization containing about 1% silicon. Low contact resistances are obtained by the formation of a titanium silicide contact layer following the deposition of a pure titanium layer.

The stability at elevated temperature and at current loads with a minimum stress, however, can only be achieved with the method of the present invention wherein both a titanium layer and a titanium nitride layer are deposited a plurality of individual layers in a cyclical process where a temperature treatment is carried out between depositions of the individual layers and the nitrogen constituent in the reaction gas during the deposition of the titanium nitride layer is adjusted higher than required for the stoichiometry of the compound titanium nitride.

In accordance with the present invention, the layer thickness of the individual layers is in the range from 3 to 5 nm, preferably at 4 nm, and the heat treatment between layer depositions is carried out in the range from 250° to 350° C., preferably at 300° C.

In a preferred form of the present invention, a DC one-chamber sputtering system is employed for the production of the layers, wherein the substrates to be coated are arranged on horizontally rotatable pallets, and the pallets are rotated during the coating, the rotational speed being adjusted such that one revolution corresponds to one cycle of deposition.

By building up the titanium nitride from a plurality of individual coats and by alternating sputtering and heating due to the rotation of the pallet, substrates are moved through under the target and under the heating sources, so as to produce a nearly stress-free layer. The wafer bending of the silicon crystal wafers having diameters of 100 mm has been found to be less than or equal to 1 micron. The wafers treated in this way are possessed of good thermal stability, withstanding a temperature of 500° C. for 30 minutes, and a current/stress load of 1.1 micron contacts in excess of 1200 hours. The wafers also have low contact resistances and diode leakage currents. The process variables are selected such that a high process reliability is accomplished, with acceptable throughput, using a sputtering power of about 3 kW.

BRIEF DESCRIPTION OF THE DRAWINGS

The invention is set forth in greater detail with reference to an exemplary embodiment, and with reference to the accompanying drawings.

DESCRIPTION OF THE PREFERRED EMBODIMENTS

Figure 1:
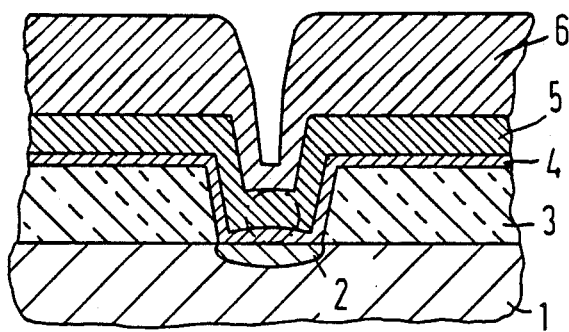
FIGS. 1 and 2 are cross sections of a layer structure manufactured in accordance with the method of the present invention, FIG. 2 representing an excerpt from FIG. 1.

In FIG. 1, reference numeral 1 illustrates a silicon substrate consisting of n+ or p+ doped shallow regions 2, and reference numeral 3 indicates an insulating layer composed, for example, of $SiO_2$ which contains the through hole. The through hole has a diameter of about 0.9 micron and a depth of 1 micron. The substrate wafer 1 should be freed of superficial oxide shortly before coating by brief etching in hydrofluoric acid for about 120 seconds. The titanium layer 4 at a layer thickness of about 20 nm is applied to the substrate across the surface in an argon plasma coating process containing at least four and preferably five coats. A titanium nitride layer 5 having a layer thickness of 100 nm and composed, for example, of at least 20 and preferably 25 coats is deposited thereon without interruption of the vacuum by adding nitrogen.

Figure 3:
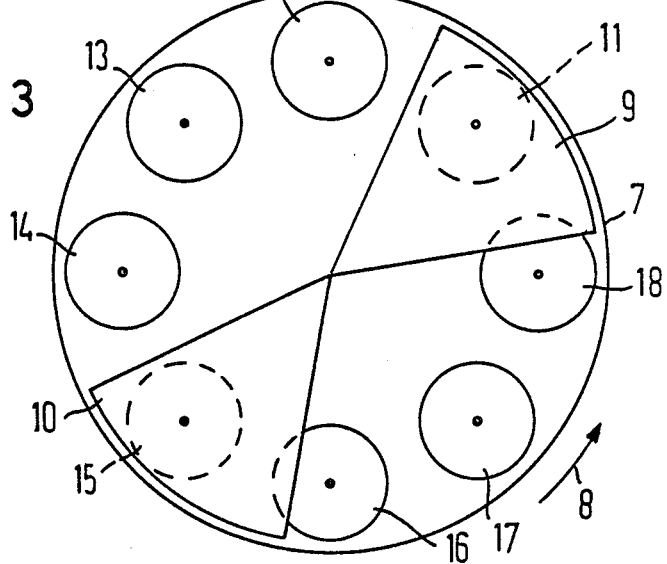
FIG. 3 is a plan view of a pallet comprising a sputtering target and a heater provided for the coating.

The initial pressure in the sputtering system amounts to at least $7 \times 10^{-5}$ pa before sputtering. For the deposition process, the sputtering chamber with pallet is brought to a temperature of about 300° C. with infrared radiators as shown in FIG. 3. For the deposition of titanium, an argon gas flow of 45 to 50 sccm may be employed. In the deposition of the titanium nitride layer 5, the gas flow may be adjusted from, for example, a previous value of 47 sccm to 20 to 25 and preferably 21 sccm argon and from 30 to 35, preferably 32 sccm nitrogen. The power applied to the titanium target shown in FIG. 3 amounts to about 3 kW. The sputtering pressure in the reaction space is about 0.7 pa.

Figure 2:
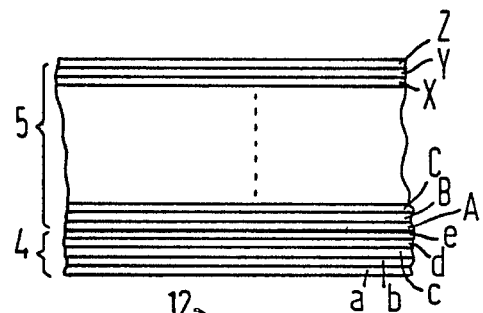

A metallization level 6 composed, for example, of aluminum/silicon or of an aluminum/silicon/copper alloy is then applied in a known way onto the double layer 4, 5 which has an overall thickness of about 120 nm and is composed of titanium/titanium nitride individually deposited layers as shown in FIG. 2.

The showing in FIG. 2 constitutes an excerpt from FIG. 1, in the region indicated by the dot-dash lines to illustrate the deposition of the individual sputtered coats, each about 4 nm thick. The individual titanium coats are identified with lower case letters and the titanium nitride coats are identified with upper case letters. The quality of the titanium nitride deposition can be visually checked after the sputtering process based on the occurrence of a brown-violet-metallic surface. The character of the surface can also be monitored by measuring the sheet resistivity (about 16 Ohm/square), and measuring the layer thickness and layer structure of the titanium nitride layer 5 with SEM registrations. The layer structure should be columnar.

As shown in FIG. 3, a rotatable pallet 7 rotates in the direction of arrow 8 through eight wafer positions, identified by reference numerals 11 through 18. A silicon crystal wafer is positioned on each of these positions in every run. The target holder comprising a titanium target has been identified at reference numeral 9 and the infrared radiator serving as a heater at reference numeral 10.

As may be seen from this figure, at least one of the 8 substrates, such as substrates 11, 15 is situated under the target 9 and under the heat radiator 10.

The sputtering process is adjusted such that, with an overall layer thickness of 120 nm, 5 revolutions of the pallet 7 are carried out for the pure titanium coating and 25 revolutions of the pallet are carried out for the titanium nitride coating. Th duration of sputtering for the 8 wafers amounts to 30 seconds for the titanium coating and to 500 seconds for the titanium nitride coating.

It will be evident that various modifications can be made to the described embodiments without departing from the scope of the present invention.

We claim as our invention:

1. A method for the production of consecutive layers of titanium and titanium nitride on a substrate which comprises:
    depositing a titanium layer on said substrate by cathode sputtering from a titanium target in a one-chamber system in several individual layers during individual cycles of deposition,
    depositing a titanium nitride layer on said substrate in the same system in the presence of nitrogen gas in several individual layers during individual cycles of deposition,
    heat treating the substrate and the deposited layers between deposition of the individual layers, and
    maintaining the nitrogen content in said system during the deposition of titanium nitride at a value in excess of that required to form stoichiometric titanium nitride.

2. A method according to claim 1, wherein the thickness of the individual layers is each in the range from 3 to 5 nm.

3. A method according to claim 1, wherein said heat treating is carried out at a temperature of from 250° to 350° C.

4. A method according to claim 1 which includes the steps of positioning a plurality of substrate pieces on a support in said system, and rotating said support during deposition of said layers such that one revolution of said support corresponds to one cycle of deposition.

5. A method according to claim 4, wherein the sputtering power is adjusted to about 3 kW.

6. A method according to claim 1, wherein the depositions are continued to deposit at least four layers of titanium and at least twenty layers of titanium nitride.

7. A method according to claim 1, wherein argon is introduced into said system as a carrier gas, and the initial pressure in said system is at least $7 \times 10^{-5}$ pa.

8. A method according to claim 1, wherein argon gas is introduced into said system at a rate of 45 to 50 sccm during the titanium deposition, argon and nitrogen are introduced into said system at a rate of 20 to 25 sccm and 30 to 35 sccm, respectively, during the titanium nitride deposition, and the sputtering pressure in said system is about 0.7 pa.

9. A method according to claim 1, wherein said substrate is cleaned in a hydrogen fluoride containing process prior to commencing the depositions.

* * * * *